United States Patent
Erle et al.

(10) Patent No.: US 6,170,078 B1
(45) Date of Patent: *Jan. 2, 2001

(54) FAULT SIMULATION USING DYNAMICALLY ALTERABLE BEHAVIORAL MODELS

(75) Inventors: Mark A. Erle, Poughkeepsie, NY (US); Matthew C. Graf, Essex Junction; Leendert M. Huisman, South Burlington, both of VT (US); Zaifu Zhang, Ottawa (CA)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/032,567

(22) Filed: Feb. 27, 1998

(51) Int. Cl.[7] .............................. G06F 17/50; G06F 9/00

(52) U.S. Cl. ................................... 716/4; 714/25

(58) Field of Search .................. 714/25; 395/500.03; 716/4

(56) References Cited

U.S. PATENT DOCUMENTS

| | | | |
|---|---|---|---|
| 4,766,595 | * 8/1988 | Gollomp | 714/33 |
| 5,325,309 | * 6/1994 | Halaviati et al. | 395/500.36 |
| 5,598,344 | * 1/1997 | Dangelo et al. | 395/500.19 |
| 5,604,895 | * 2/1997 | Raimi | 395/500.34 |
| 5,744,946 | * 4/1998 | Lucas | 324/73.1 |

OTHER PUBLICATIONS

Ghosh; "Behavioral–Level Fault Simulation"; IEEE Design and Test of Computers; pp. 31–42, Jun. 1988.*

Amendola et al.; Fault Behavior Observation of a Microprocessor System through a, VHDL Simulation Based Fault Injection Experiment; IEEE EURO–DAC96 pp. 536–541, Sep. 1996.*

Distante et al: A PES: An Integrated System for Behavioral Degin, Simulation and Evaluation of Array Processors; IEEE ICCD '88; pp. 568–572, Nov. 1988.*

(List continued on next page.)

*Primary Examiner*—Kevin J. Teska
*Assistant Examiner*—Hugh Jones
(74) *Attorney, Agent, or Firm*—Patrick J. Daugherty; Driggs, Lucas, Brubaker & Hogg Co., L.P.A.

(57) ABSTRACT

A system and method for the fault simulation testing of circuits by using a behavioral model is provided. The behavioral model includes a fault bus, decoder, and input and output ports. The decoder decodes mapping fault values, which are applied to the fault bus, to either a no-fault or to a specific fault which is internally encoded into the behavioral model. Accordingly, a single behavioral model can be used to dynamically model a fault-free circuit or machine and one or more faulty circuits or machines based on the mapping fault data applied to each model's fault bus. A fault simulation tool applies test simulation data having mapping fault and test parameter data to at least two identically coded behavioral models (i.e., a fault-free model and a faulty model, as defined by the applied mapping fault data). Output data are generated by each behavioral model and recorded by the fault simulation tool. A comparison of the output data of the fault-free behavioral model and the at least one faulty behavioral model is performed to determine whether the test pattern data detected differences therebetween.

21 Claims, 5 Drawing Sheets

OTHER PUBLICATIONS

Delong et al.; A Fault Injection Technique for VHDL Behavioral Level Models; IEEE Degin & Test of Computers; 13#4; pp. 24–33, 1996.*

Waid et al.; Behavioral Fault Simulation in VHDL; IEEE 27 ACM/IEEE DAC; pp. 587–593, Jun. 1990.*

Devar Ayanadurg et al.; Hierarchy Based Statistical Fault Simulation of Mixed Signal ICS IEEE Test Conf; pp 521–527, Oct. 1996.*

Noh et al.; Behavioral Fault Simulation and ATPG, System for VADL; ASIC Conf., $7^{th}$ Annual, pp. 412–416, Sep. 1994.*

Chen et al.; Analysis of the Ggp. Between Behaviroal & Gate Level Fault Simulation; IEEE $6^{th}$ Annual ASIC; pp. 144–147, Sep. 1993.*

* cited by examiner

FAULT SIMULATION USING DYNAMICALLY ALTERABLE BEHAVIORAL MODELS

FIELD OF THE INVENTION

The invention relates generally to the fault testing of electrical circuits, and, more particularly, to a system and method for simulating faults having dynamically alterable behavioral models of embedded circuits.

BACKGROUND OF THE INVENTION

Electrical circuits, and digital circuits in particular, must be rigorously tested prior to being brought to market. Such testing insures a level of quality and functionality in a proposed circuit design before large amounts of time, money, and other resources are expended in manufacturing the product. Such testing further insures a level of quality and functionality during the manufacturing process where the circuit design actually implemented may be tested. Accordingly, devices known as Fault Simulation Tools have been developed to allow circuit designers to verify and test their designs both prior to prototyping and during manufacturing. An example of such circuit designs include embedded memories (i.e., instruction cache, data cache, etc.) within microprocessors such as, for example, the Intel PENTIUM® processor. The circuit designs of these embedded memories require extensive testing in order to ensure proper operation of the processor. Otherwise, data may be erroneously modified and the processor may work improperly or may not work at all.

One approach employing fault simulation tools entails the development of a gate-level fault model which is composed of simpler fault model elements. However, this approach is non-trivial and for large memories consumes large amounts of memory or circuitry in the fault simulation tool. Additionally, the types of detectable faults are limited to the fault models supported by the fault simulation tool. Other approaches employing fault simulation tools only allow the simulation of faults at the perimeter of the fault model, thus sacrificing faults internal to the model. Accordingly, a system and method which overcomes these disadvantages is desired.

SUMMARY OF THE INVENTION

According to one aspect of the present invention, a method for fault simulation testing of circuits is provided. The method includes the steps of: providing a behavioral model of a circuit to be tested, wherein the behavioral model comprises at least one fault bus line; applying fault simulation test data to the behavioral model; and recording the behavior of the behavioral model to determine whether a defect is present.

The fault simulation tool applies mapping fault and test pattern information to the behavioral model. The behavioral model associates the mapping fault values on the fault bus with a predetermined behavior, which may be a defect or other condition, in the behavior model. The mapping fault information applied to the fault bus includes stuck-at-0 and stuck-at-1 faults or defects. A stuck-at-0 defect is defined as maintaining a particular bit at a zero value regardless what value is being written to or read from the bit. Similarly, a stuck-at-1 maintains a particular bit value at one. Once the predetermined behavior is known, the behavioral model acts accordingly, generating data based on the predetermined behavior. The data is read by the fault simulation tool and analyzed to determine whether the fault simulation test parameter data (sometimes hereinafter referred to as "test pattern") detected the predetermined behavior or defect. Such analysis is facilitated by applying the mapping fault information and test pattern information to at least one faulty behavioral model and one fault-free behavioral model with a comparison of the results.

It is therefore an advantage of the present invention to provide a system and method for the fault testing of circuits with behavioral models that allow the representation of internal circuit faults.

It is a further advantage of this invention to provide a system and method for conveying unique defect information to a circuit behavioral mode.

It is still further an advantage of the present invention to extend the fault model testing capabilities of simple fault model testing tools to any fault capable of being behaviorally modeled.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
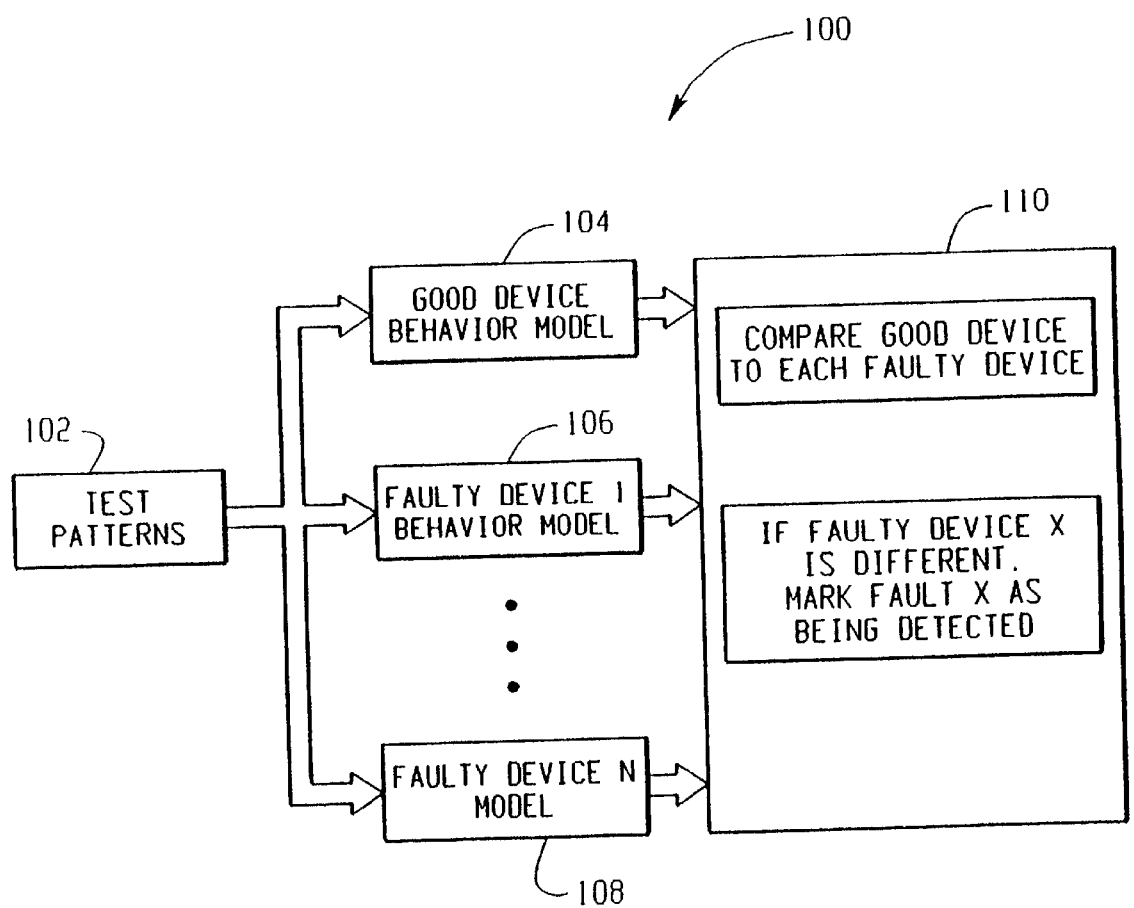
FIG. 1 is block diagram of the overall system of the present invention.

Referring now to FIG. 1, a block diagram of a fault system 100 of the present invention is shown. The fault system 100 includes at least one test pattern 102 which is applied to at least one good device behavioral model 104 and N faulty device behavioral models 106 to 108. N may be any integer equal to or greater than 1. As will be described in more detail hereinafter, a machine or device behavioral model is a functional representation of the device or machine. For example, the device may be a microprocessor with an embedded memory array. In such a case, the behavioral model can be a functional representation of the embedded memory array within the microprocessor. Other examples of behavioral models include ALU's, instruction decoders, and any other circuits embedded within other circuitry.

The good device behavioral model 104 is a functional representation of a device or embedded circuit having no defects. Conversely, faulty device behavioral models 106 to 108 are functional representations of devices having predetermined defects. Each faulty device behavioral model 106–108 preferably includes a unique defect. The test patterns 102 are applied to the behavioral models 104–108 by a fault simulation tool. The fault simulation tool also reads, stores, and analyzes the test pattern results from each tested device. The analysis 110 of the test results includes comparing the outputs of the good device 104 to each of the faulty devices 106–108 to determine if the test pattern detected differences therebetween. For each difference detected, the test program is marked as detecting the predetermined defect. In this manner, the scope of fault coverage by the test pattern may be determined. In the preferred embodiment, the fault simulation tool is a Paradigm XP high-performance simulation system which is manufactured by ZYCAD Corp. The Paradigm XP system comprises an application-specific computer that is strictly optimized for logic and fault simulation. However, any fault simulation system which supports behavioral modeling may be employed including, for example, PC-based fault simulation systems.

Figure 2A:
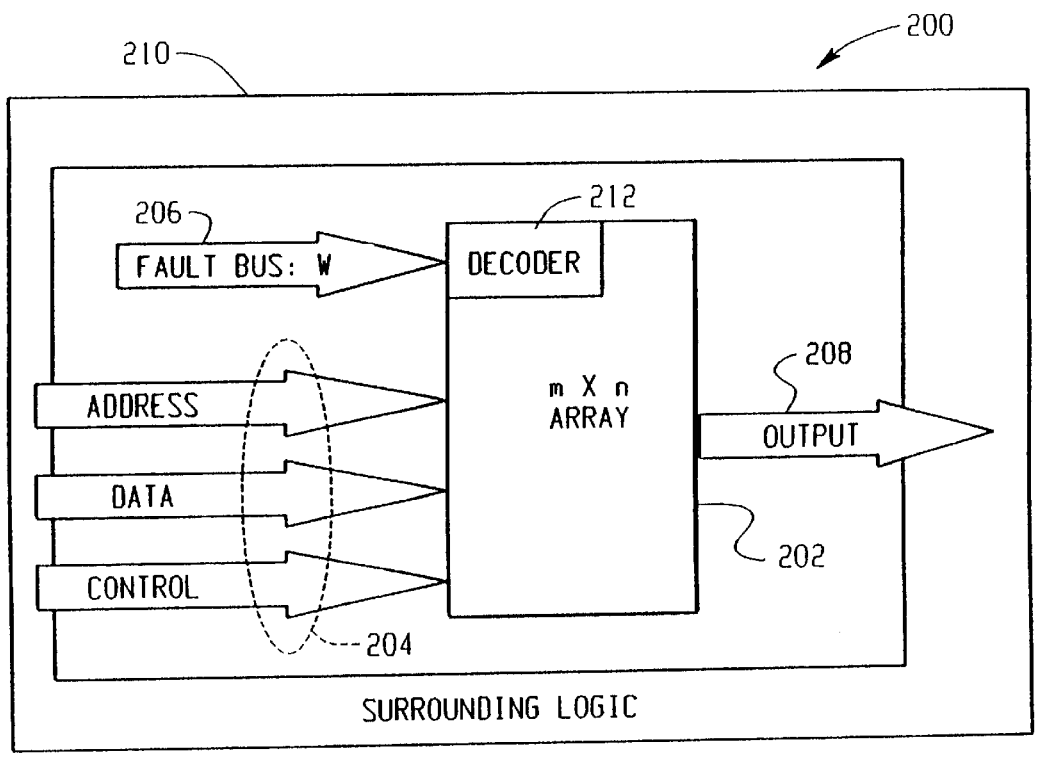
FIG. 2A is a block diagram of a first embodiment of a behavioral model of a memory array of the present invention.

Illustrated in FIG. 2A is a block diagram of a first embodiment of a behavioral model 200 of a memory array. The model 200 includes an "m×n" array 202 and address, data, and control buses 204, and a fault bus 206. The model 200 further includes an output bus 208. The fault bus includes w bus lines where w is equal to "m×n." For example, for a 2×2 array 202, the fault bus includes 4 bus lines.

A decoder within the model 200 decodes the value (i.e., mapping fault data) placed on the fault bus 206 by the fault simulation tool into a unique function (i.e., a mapped fault) by which the behavioral model acts accordingly (See Table 1). The unique functions of the present invention are preferably stuck-at-0 and stuck-at-1 memory array cell faults. However, other fault models can also be employed including, for example, Short or Bridging Fault Models, Open Fault Models, and Delay Fault Models.

In a Short or Bridging Fault Model, a short circuit is created by the fault modeling system placing a marker on at least two nets. A net is a wire, line, and/or signal between two points (e.g., net A connects the output of And X to the input of Inverter Y). The behavioral model could scan the fault bus nets looking for one or more markers which would indicate a short or bridge between two nets (i.e., two fault bus lines). Each unique grouping of markers can then be mapped by the behavioral model into any desirable defect.

In an Open Fault Model, an open circuit is created by the fault modeling system by disconnecting a net from a source. For example, the fault bus could be tied to ground or LOW outside the behavioral model with the fault modeling system randomly disconnecting one or more bus lines from the ground or low. The behavioral model can then scan the fault bus looking at all the nets for a non-ground signal or, alternatively, a high impedance. Each open circuit could then be mapped by the behavioral model into any desirable defect.

Referring once again to FIG. 2A and the stuck-at fault model, for a 2×2 memory array, a 4-bit wide fault bus 206 is required to simulate a stuck-at-0 and a stuck-at-1 for each cell. For example, in FIG. 1, a first faulty device may have a stuck-at-0 on bit 1 of its fault bus; a second faulty machine may have a stuck-at-1 on bit 2 of its fault bus, and so on. It should be apparent that numerous combinations are possible. It should also be apparent that the behavioral model may be designed such that the fault bus values designate other defects such as, for example, transition faults or destructive read faults, rather than stuck-at-0 or stuck-at-1 cell defects.

Figure 2B:
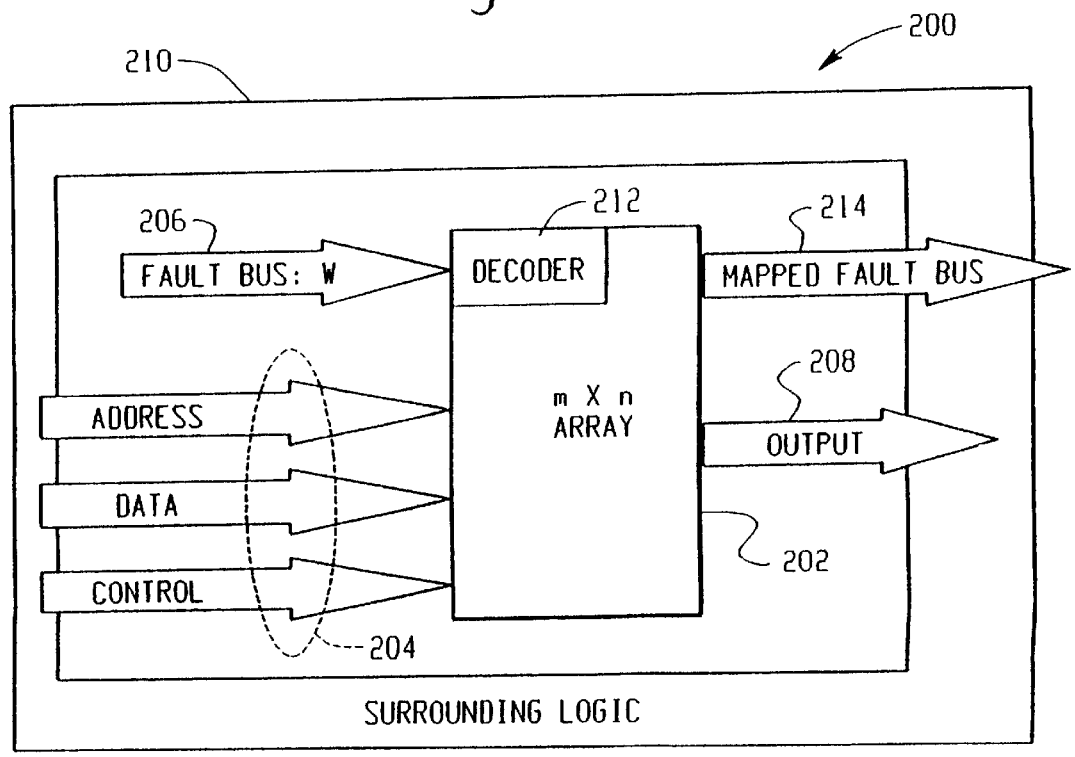
FIG. 2B is a block diagram of a second embodiment of a behavioral model of a memory array of the present invention.

Shown in FIG. 2B is a second illustrated embodiment of a behavioral model of a memory array of the present invention. The basic components are the same as those described and illustrated in FIG. 2A. However, the behavioral model of FIG. 2B further includes a mapped fault bus 214. For complex behavioral models which include a plurality of different fault models such as, for example, stuck-at and delay faults, a mapped fault value is placed on the mapped fault bus 214 which indicates the specific type of fault which has been applied. This information may be read and analyzed by the fault simulation tool.

Figure 3:
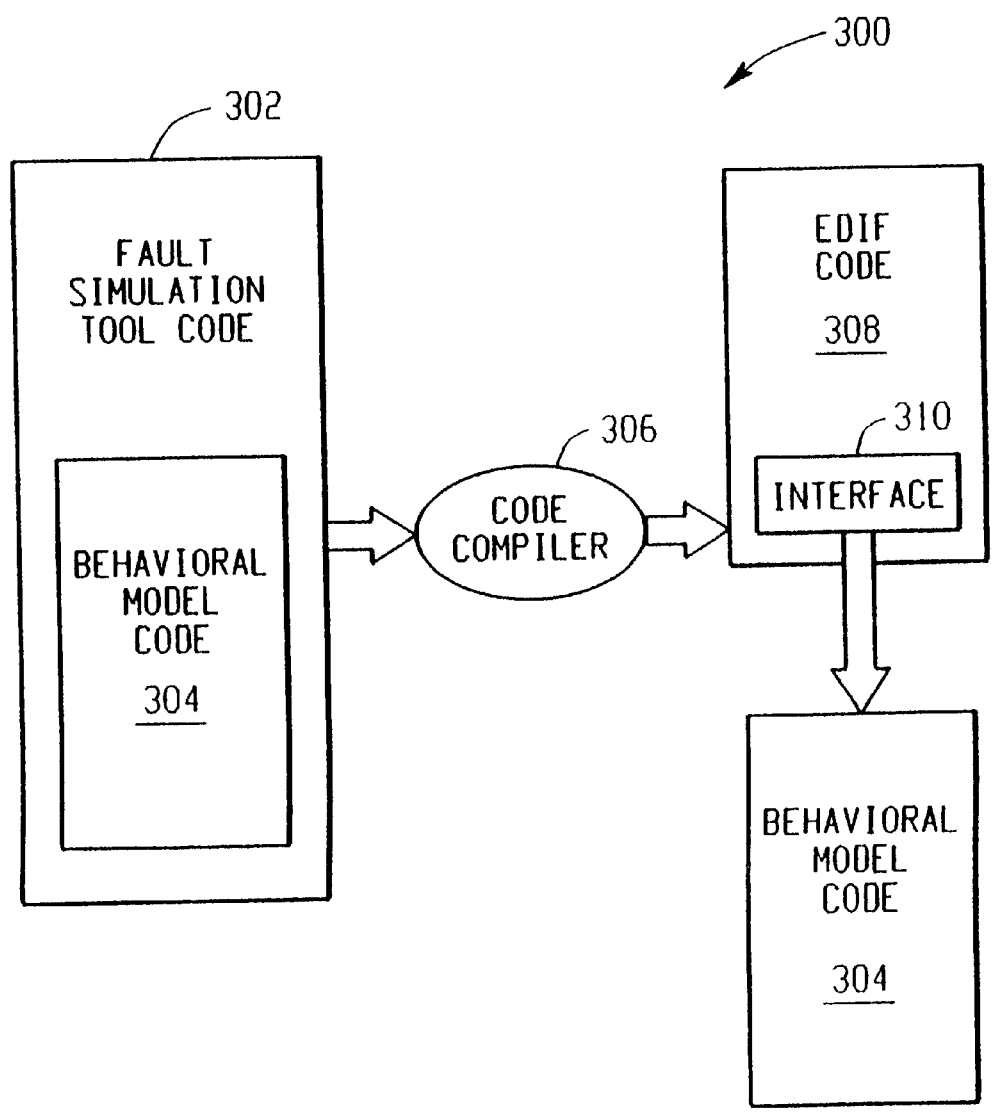
FIG. 3 is a block diagram of various logic components of the present invention.

Illustrated in FIG. 3 is a block diagram 300 of the various software objects or logic of the present invention. In particular, the present invention includes a fault simulation tool code 302 having one or more behavioral model codes 304. In the preferred embodiment, the fault simulation tool code is written in the Paradigm XP high-performance fault simulation system XPLUS programming protocol (both by ZYCAD Corp.). The behavioral model code(s) 304 are preferably written in the "C" programming language.

Generally, the behavioral model code 304 is written to describe the functional characteristics of the circuit(s) desired to be tested. These functional characteristics include port and pin definitions, data types, logic functions, and mapping schemes. The behavioral model code 304 embedded within the fault simulation tool code 302 includes port and variable declarations. An example of fault simulation tool code written for the Paradigm XP system by ZYCAD Corp. for a "2×2" memory array is listed in Table 2.

The fault simulation tool code 302 is compiled by a code compiler 306 within the fault simulation tool to generate EDIF (Electronic Data Interchange Format) code 308. EDIF is an industry standard language used to interchange design data between EDA (Electronic Design Automation) systems and their tools. See also IEC 1690-1. The Paradigm XP system by ZYCAD Corp. generates and employs EDIF code. Other EDA standards, such as VHDL and Verilog also exist.

The compiler 306, cognizant of the behavioral model code 304 within the fault simulation tool code 302, generates an interface module within the EDIF code 308 that interfaces the EDIF code 308 to the behavioral model code 304. Hence, as testing parameters are applied to the EDIF code 308, the parameters are interfaced to the behavioral model code 304 via the interface 310. An example of the EDIF generated code for the "2×2" memory array fault simulation tool code of Table 2 is listed in Table 3. The corresponding behavioral model code is listed in Table 4.

Referring now once again to FIG. 2A, the behavioral model, constructed with the fault bus 206, may be tested by the fault simulation tool. Specifically, the fault simulation tool applies test data to the defined input ports which includes, for example, applying mapping fault data to the fault bus 206, and test pattern data to the Address, Data, and/or Control buses 204 of the behavioral model. The test pattern data is user defined and includes, for example, control data having clock, address, and/or data information. Through the application of the mapping fault data on the fault bus 206, the behavioral model of the memory array 202 exhibits a predetermined behavior simulating an internal defect or fault. The output of bus 208 is read and analyzed for detection of any defect.

Figure 4A:
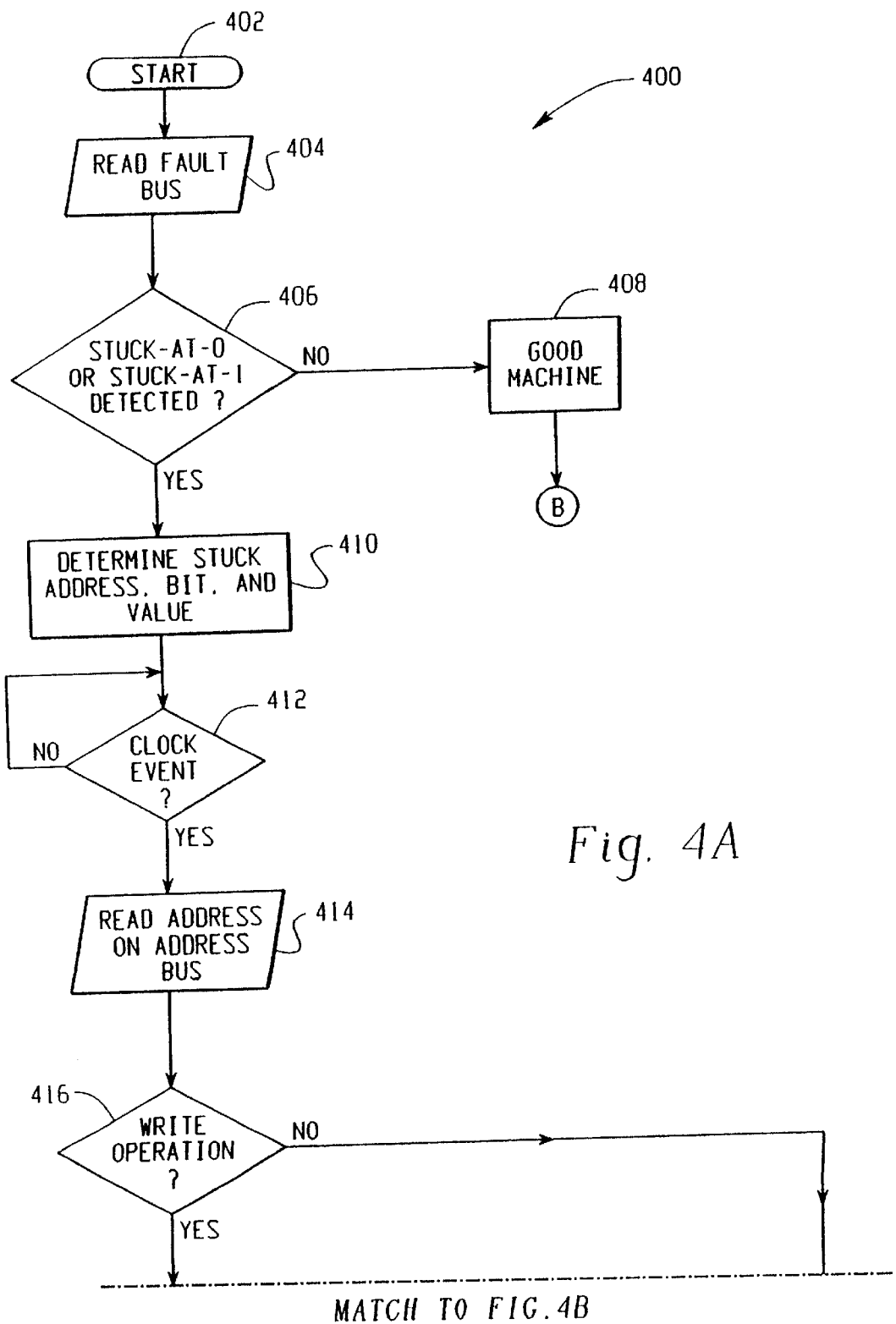
FIGS. 4A–4B is a flowchart illustrating a behavioral model for a memory array.
Figure 4B:
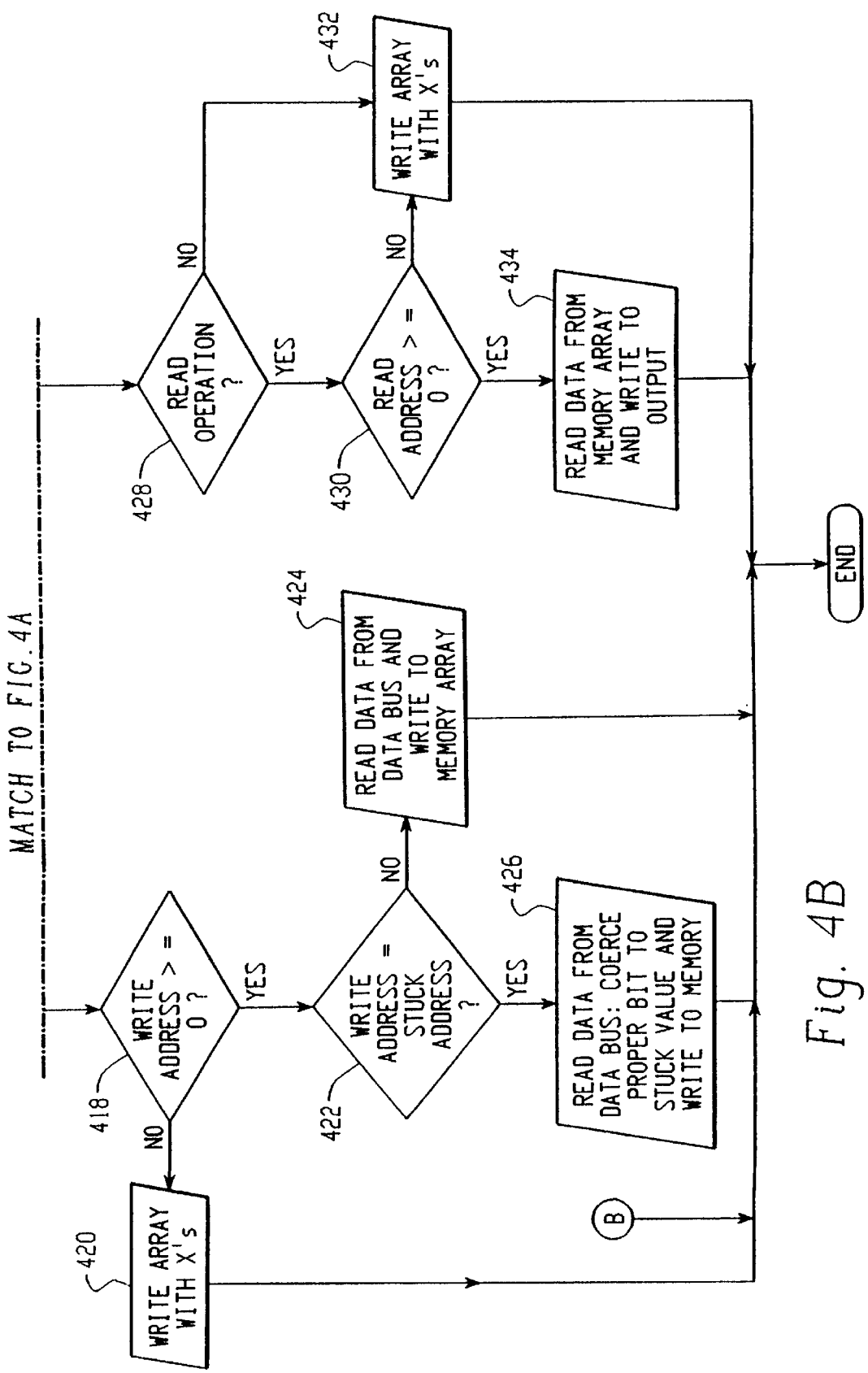

Referring now to FIG. 4, a high-level flowchart of a behavioral model logic 400 for a memory array is illustrated. The behavioral model logic 400 begins in step 402 and advances to step 404. In step 404, the model logic reads the fault bus to determine the mapping fault value(s) thereon. After step 404, the model logic advances to step 406 where it determines the type of fault, e.g., a stuck-at-0 or a stuck-at-1, which has been designated for a particular memory array cell via the mapping fault value(s) on the fault bus. Table 1 illustrates one particular example of fault bus values and the corresponding defects for a 2×2 memory array.

TABLE 1

Example: Fault Bus Defect Mapping for 2 x 2 Memory

| (Mapping Fault Data) | (Mapped Fault) | | | |
| --- | --- | --- | --- | --- |
| Fault Bus Value | Cell 3 | Cell 2 | Cell 1 | Cell 0 |
| X X X X | OK | OK | OK | OK |
| X X X 1 | OK | OK | OK | Stuck 1 |
| X X X 0 | OK | OK | OK | Stuck 0 |
| X X 1 X | OK | OK | Stuck 1 | OK |
| X X 0 X | OK | OK | Stuck 0 | OK |
| X 1 X X | OK | Stuck 1 | OK | OK |
| X 0 X X | OK | Stuck 0 | OK | OK |
| 1 X X X | Stuck 1 | OK | OK | OK |
| 0 X X X | Stuck 0 | OK | OK | OK |

In Table 1, an "X" value indicates that no value has been placed on that particular fault bus line. If neither a stuck-at-0 or a stuck-at-1 mapping fault has been designated on any fault bus line, then the present behavioral model is fault-free, or a good machine. If either a stuck-at-0 or a stuck-at-1 has been designated, the model logic advances to step 410.

In step 410, the model logic determines the stuck address (i. e., row), bit (i. e., column), and value from the mapping fault value(s) present on the fault bus. After step 410, the model logic proceeds to step 412 where the logic tests to determine whether a clock event has occurred. If a clock event has not occurred, the model logic loops back and waits until a clock event occurs. Once a clock event occurs, the model logic reads the value present on the address bus and proceeds to step 416.

In step 416, the model logic tests to determine whether a write operation has been initiated. If a write operation has been initiated, in step 416, the logic advances to step 418. In step 418, the model logic tests to determine whether the address being written to is equal to or greater than zero. If the address being written to is not equal to or greater than zero, the entire memory array is filled with "X's." In the Paradigm XP fault simulation system, as well as in other fault simulation systems, an "X" bit represents a valid bit which can be either a "0" or a "1." If, however, in step 418, the address being written to is equal to or greater than zero, then the model logic advances to step 422.

In step 422, the model logic tests to determine whether the address being written to is equal to the stuck address determined in step 410. If the address being written to is equal to the stuck address, the model logic proceeds to step 426. In step 426, the model logic reads the data value present on the data bus, alters the appropriate bit of data value so as to create the stuck value and writes the stuck value to the memory address. If the address being written to is not equal to the stuck address in step 422, the model logic proceeds to step 424. In step 424, the data value present on the data bus is read and written directly to the address without alteration. After either step 424 or step 426, the model logic ends until new test data is applied.

If, however, in step 416, a write operation has not been initiated, the model logic advances to step 428. In step 424, the model logic tests to determine whether a read operation has been initiated. If a read operation has been initiated, then the model logic advances to step 430. In step 430, the address being read from is tested to determine whether it is equal to or greater than zero. If the address being written is equal to or greater than zero, the model logic proceeds to step 434. In step 434, the model logic reads the data present in the memory array cell address and writes that value to the output bus. If, however, in step 430, the address being written to is not equal to or greater than zero, the logic advances to step 432. Also, if in step 428 a read operation has not been initiated, the model logic advances to step 432. In step 432, the model logic writes "X's" to the memory array output bus. After either step 432 or step 434, the model logic ends until new test data is applied.

While the illustrated embodiment has been described in FIG. 4 with "coercion" or alteration of the stuck bit during a write operation (i.e., step 426), one alternative method is to "coerce" or alter the stuck bit upon a read operation to a stuck address. Accordingly, the flowchart of FIG. 4 would include the steps of comparing the read address to the stuck address and if equal, reading the data from the read address and altering the stuck bit to the proper stuck value. This approach is shown in tables 2 and 4 through commented code sections.

In testing a 2×2 memory array for all stuck-at-0 and stuck-at-1 faults, 9 behavioral models are required. More generally, 2w+1 behavioral models are required to test a memory array for all stuck-at faults, where w is equal to the array size (i.e., m×n) and the additional one is for a required good or fault-free machine. Thus, for the 2×2 memory array, eight behavioral models have unique stuck-at faults and one behavioral model is fault-free. Additional behavioral models may be implemented for additional defects, such as combinational stuck-at faults and stuck-at faults combined with transition and/or destructive read faults. In the preferred embodiment, the Paradigm XP fault system applies the test data (e.g., mapping fault data and test pattern data) to the behavioral model and generates a series of test results. The test results include, for example, listings of the fault, address, data, and control values applied to the model and the corresponding output behavior of the model. Alternatively, each behavioral model may be programmed to generate its own results output in the form of a graphical display or file. Accordingly, the test coverage provided by a particular user defined test pattern can be determined from the results output.

While the present invention has been illustrated by the description of embodiments thereof, and while the embodiments have been described in considerable detail, it is not the intention of the applicant's to restrict or in any way limit the scope of the appended claims to such detail. Additional advantages and modifications will readily appear to those skilled in the art. For example, the fault bus of the behavioral models of the present invention may be used to simulate faults in ALU's, buffers, or any element that can defined behaviorally. Additionally, the logic illustrated by the present disclosure serves to only example the principles of the present invention. Therefore, the invention, in its broader aspects, is not limited to the specific details, the representative apparatus, and illustrative examples shown and described. Accordingly, departures may be made from such details without departing from the spirit or scope of the applicants' general inventive concept.

TABLE 2

```
%BMOD_INFO
name MEM_BEH
port    input    fault_bus    fault_event    —    16    # for faulting
port    input    address      —             —    2
port    input    data         —             —    4
port    input    read         —             —
port    input    write        —             —
port    input    clock        clock_event   —
port    output   output       —             —    4
ptr     long     ram
var     RANGE    rDumpAddr
# variables for stuck cell
var     int      stuck_addr
var     int      stuck_bit
var     LGC      stuck_value
var     LGC_ARRAY  word
%%
%BMOD_HDR
#include "ibm.h"
/* type definition for stuck cell */
typedef LGC LGC_ARRAY[4];
%%
%BMOD_NOTE
----------------------------------------------------------------------
BMOD to demonstrate if cell stuck at faults can be detected
----------------------------------------------------------------------
%%
%BMOD_CODE
#include <stdio.h>
#include <assert.h>
#include "cstyle2.h"
#include "bmod.h"
#include "MEM_BEH.h"
static int total_lines = 4;
static int data_bits = 4;
static int addr_bits = 2;
m1000_MEM_BEH_open ( ) {
    int array_cells;
    int long_words;
    /*
```

$$\frac{\# \text{ cells}}{\text{array}} * \frac{\# \text{ bits}}{\text{cell}} + \left| \frac{\# \text{ bits}}{\text{long word}} - 1 \right| / \frac{\# \text{ bits}}{\text{long word}} = \frac{\# \text{ long words}}{\text{array}}$$

```
    */
    array_cells = total_lines * data_bits;
    long_words=((array_cells * 2) + (sizeof(long) * 8 - 1)) / (sizeof(long)*8);
    PtrAllocate(&ram,long_words * sizeof(long));
    FillArrayValue((uchar *)ram,2,data_bits,0,total_lines-1,(int)lgcX);
    /* set up for dumping the entire array in binary */
    rDumpAddr[0].ulStartAddr = 0;
    rDumpAddr[0].ulEndAddr   = total_lines-1;
    printf("MEM: Initialized array to lgcX\n");
    /* check to see if width of 'fault_bus' equals number of cells */
    if (iGetPinArraySize(fault_bus) != array_cells) {
        printf("MEM: fault bus width not equal to # of array cells!\n");
    }
    /* initialize variable so I can identify good machine */
    stuck_addr = -1;
}
m1000_MEM_BEH_fault_event ( ) }
    int i;
    LGC lgc_fault_pin;
    int fault_bus_size = iGetPinArraySize(fault_bus);
    /* read 'fault bus' for stuck-at cell */
    for (i=0;i<fault_bus_size;i++) {
        lgc_fault_pin = lgcGetPin(usrpinSelectPin(fault_bus,i));
        /*printf("MEM: pin %d has value %c\n",i,convert_lgc(lgc_fault_pin));*/
        if (lgc_fault_pin == lgc1 || lgc_fault_pin == lgc0) {
            stuck_addr = i / data_bits;
            stuck_bit = i % data_bits;
            stuck_value = lgc_fault_pin;
            printf("MEM: stuck@%c on bit %d of word %d\n",
                convert_lgc(stuck_value),stuck_bit,stuck_addr);
            break;
```

TABLE 2-continued

```
            }
        }
    }
}
m1000_MEM_BEH_restart ( ) { }
m1000_MEM_BEH_error ( ) { }
m1000_MEM_BEH_close ( ) { }
m1000_MEM_BEH_clock_event ( ) {
    LGC lgc_clock = lgcGetPin(clock);
    LGC lgc_read = lgcGetPin(read);
    LGC lgc_write = lgcGetPin(write);
    int int_addr;
    int i;
    if (lgc_clock == lgc1) {
        int_addr = iGetPinArray(address);
        if (lgc_write == lgc1) {            /* writing */
            if (int_addr >= 0) {
                /* start of newly added write function */
                if (int_addr != stuck_addr) {
                    if (stuck_addr != -1) {
                        printf("MEM(time %g): write high, address %d,
stuck address %d —> writing array",
                                    dGetUserTime( ),int_addr,stuck_addr);
                        iGetArrayValue(data,(uchar *)ram,2,int_addr);
                    } else {
                        printf("MEM(time %g): write high, address %d
—> writing array",
                                    dGetUserTime( ),int_addr);
                        iGetArrayValue(data,(uchar *)ram,2,int_addr);
                    }
                } else {
                    InputToBuffer(data,0,word,0,data_bits-1);
                    if (word[stuck_bit] != stuck_value) {
                        printf("MEM(time %g): write high, address %d,
stuck address %d —> writing array, altering stuck bit %d (%c to %c)",
dGetUserTime( ),int_addr,stuck_addr, stuck_bit, convert_lgc(word[stuck_bit]
),convert_lgc(stuck_value));
                    } else {
                        printf("MEM(time %g): write high, address %d,
stuck address %d —> writing array",dGetUserTime( ),int_addr,stuck_addr);
                    }
                    word[stuck_bit] = stuck_value;
                    BufferToArray(word,0,data_bits-1,(uchar
*)ram,2,data_bits,int_addr,0);
                }
                /* end of newly added write function */
                /* start of originally added write statement
                printf("MEM(time %g): write high, address %d —> writing
array",dGetUserTime( ),int_addr);
                iGetArrayValue(data,(uchar *)ram,2,int_addr);
                end of originally added write statement */
                if (stuck_addr == -1) {
                    printf(" —— GOOD MACHINE!!!\n");
                } else {
                    printf("\n");
                }
            } else {
                printf("MEM(time %g): write high, address X —> filling
array with Xs",dGetUserTime( ));
                FillArrayValue((uchar *)ran,2,data_bits,0,total_lines-
1,(int)lgcX);
                if (stuck_addr == -1) {
                    printf(" —— GOOD MACHINE!!!\n");
                } else {
                    printf("\n");
                }
            }
        } else if (lgc_write == lgcX) {
            if (int_addr >= 0) {
                printf("MEM(time %g): write X, address %d —> filling
word with Xs",dGetUserTime( ),int_addr);
                FillArrayValue((uchar
*)ram,2,data_bits,int_addr,int_addr,(int)lgcX);
            } else {
                printf("MEM(time %g): write X, address X —> filling
array with Xs",dGetUserTime( ),int_addr);
                FillArrayValue((uchar *)ram,2,data_bits,0,total_lines-
1,(int)lgcX);
            }
```

TABLE 2-continued

```
            if (stuck_addr == -1) {
                printf(" —— GOOD MACHINE!!!\n");
            } else {
                rpintf("\n");
            }
        }
        if (lgc_read == lgc1) {      /* reading */
            if (int_addr >= 0) {
                /* start of newly added read function */
                printf("MEM(time %g): read high, address %d —> reading
array",dGetUserTime( ),int_addr);
                SetArrayValue(output,(uchar *)ram,2,int_addr);
                /* end of newly added read function */
                /* start of originally added read function
                if (int_addr != stuck_addr) {
                    if (stuck_addr != -1) {
                        printf("MEM(time %g): read high, address %d,
stuck address %d —> reading array",
                            dGetUserTime( ),int_addr,stuck_addr);
                    } else {
                        printf("MEM(time %g): read high, address %d
—> reading array",
                            dGetUserTime( ),int_addr);
                    }
                    SetArrayValue(output,(uchar *)ram,2,int_addr);
                } else {
                    ArrayToBuffer(word,0,data_bits-1,(uchar
*)ram,2,data_bits,int_addr,0);
                    if (word[stuck_bit] != stuck_value) {
                        printf("MEM(time %g): read high, address %d,
stuck address %d —> reading array, altering stuck bit %d (%c to %c)",
dGetUserTime( ),int_addr,stuck_addr,stuck_bit,convert_lgc(word[stuck_bit]
),convert_lgc(stuck_value));
                    } else {
                        printf("MEM(time %g): read high, address %d,
stuck address %d —> reading array",dGetUserTime( ),int_addr,stuck_addr);
                    }
                    word[stuck_bit] = stuck_value;
                    BufferToOutput(output,0,0word,0,data_bits-1);
                }
                end of originally added read function */
                printf(", pending output: ");
                for (i=0;i<data_bits;i++) {
printf("%c",convert_lgc(lgcGetPending(usrpinSelectPin(output,i))));
                }
                if (stuck_addr == -1) {
                    printf(" —— GOOD MACHINE!!!\n");
                } else {
                    printf("\n");
                }
            } else {
                printf("MEM(time %g): read high, address X —> sourcing
Xs",dGetUserTime( ),int_addr);
                SetPinLgc(output,lgcX);
                if (stuck_addr == -1) {
                    printf(" —— GOOD MACHINE!!!\n");
                } else {
                    printf("\n");
                }
            }
        } else if (lgc_read == lgcX) {
            printf("MEM(time %g): read X —> sourcing
Xs",dGetUserTime( ),int_addr);
            SetPinLgc(output,lgcX);
            if (stuck_addr == -1) {
                printf(" —— GOOD MACHINE!!!\n");
            } else {
                printf("\n");
            }
        }
    } else if (lgc_clock == lgcX) {
        printf("MEM(time %g): clock X —> sourcing
Xs\n",dGetUserTime( ),int_addr);
        SetPinLgc(output,lgcX);
    }
}
%%
```

TABLE 3

(edif library
(edifVersion 2 0 0)
(edifLevel 2)
(keywordMap (keywordlevel 3))
(Userdata NetProp "DTNALS")
(library MEM
(edifLevel 2)
(technology
  (cell MEM_BEH (cellType GENERIC)
    (view logic (viewType NETLIST)
     (interface
      (port (array fault_bus 16) (direction input)
      (port (array address 2) (direction input)

TABLE 3-continued (port (array data 4) (direction input))
      (port read (direction input))
      (port write (direction input))
      (port clock (direction input))
      (port (array output 4) (direction output))
     )
    (userData (M1000dev MEM_BEH)
    (property BMOD)
    )
  )
)
(design PPC (cellref MEM_BEH (libraryref MEM))))

TABLE 4

```
# line 39 "MEM_BEH.bmod"
#include <stdio.h>
#include <assert.h>
#include "cstyle2.h"
#include "bmod.h"
#include "MEM_BEH.h"
static int total_lines = 4;
static int data_bits = 4;
static int addr_bits = 2;
m1000_MEM_BEH_open ( ) {
    int array_cells;
    int long_words;
    */
```

$$\frac{\# \text{ cells}}{\text{array}} * \frac{\# \text{ bits}}{\text{cell}} + \left| \frac{\# \text{ bits}}{\text{long word}} - 1 \right| / \frac{\# \text{ bits}}{\text{long word}} = \frac{\# \text{ long words}}{\text{array}}$$

```
    */
    array_cells = total_lines * data_bits;
    long_words=((array_cells * 2) + (sizeof(long) * 8 - 1)) /
(sizeof(long) *8);
    PtrAllocate(&ram,long_words * sizeof(long));
    FillArrayValue((uchar *)ram,2,data_bits,0,total_lines-1,(int)lgcX);
    /* set up for dumping the entire array in binary */
    rDumpAddr[0].ulStartAddr = 0;
    rDumpAddr[0].ulEndAddr   = total_lines-1;
    printf("MEM: Initialized array to lgcX\n");
    /* check to see if width of 'fault_bus' equals number of cells */
    if (iGetPinArraySize(fault_bus) != array_cells) {
        printf("MEM: fault bus width not equal to # of array cells!\n");
    }
    /* initialize variable so I can identify good machine */
    stuck_addr = -1;
}
m1000_MEM_BEH_fault_event ( ) {
    int i;
    LGC lgc_fault_pin;
    int fault_bus_size = iGetPinArraySize(fault_bus);
    /* read 'fault_bus' for stuck-at cell */
    for (i=0;i<fault_bus_size;i++) {
        lgc_fault_pin = lgcGetPin(usrpinSelectPin(fault_bus,i));
        /*printf("MEM: pin %d has value
%c\n",i,convert_lgc(lgc_fault_pin));*/
        if (lgc_fault_pin == lgc1 || lgc_fault_pin == lgc0) {
            stuck_addr = i / data_bits;
            stuck_bit = i % data_bits;
            stuck_value = lgc_fault_pin;
            printf("MEM: stuck@%c on bit %d of word %d\n",
                convert_gc(stuck_value),stuck_bit,stuck_addr);
            break;
        }
```

TABLE 4-continued

```
        }
}
m1000_MEM_BEH_restart ( ) { }
m1000_MEM_BEH_error ( ) { }
m1000_MEM_BEH_close ( ) { }
m1000_MEM_BEH_clock_event ( ) {
    LGC lgc_clock = lgcGetPin(clock);
    LGC lgc_read = lgcGetPin(read);
    LGC lgc_write = lgcGetPin(write);
    int int_addr;
    int i;
    if (lgc_clock == lgc1) {
        int_addr = iGetPinArray(address);
        if (lgc_write == lgc1) {      /* writing */
            if (int_addr >= 0) {
                /* start of newly added write function */
                if (int_addr != stuck_addr) {
                    if (stuck_addr != -1) {
                        printf("MEM(time %g): write high, address %d, stuck address %d —> writing array",
                            dGetUserTime(),int_addr,stuck₁₃ addr);
                        iGetArrayValue(data,(uchar *)ram,2,int_addr);
                    } else {
                        printf("MEM(time %g): write high, address %d —> writing array",
                            dGetUserTime( ),int_addr);
                        iGetArrayValue(data,(uchar *)ram,2,int_addr);
                    }
                } else {
                    InputToBuffer(data,0,word,0,data_bits-1);
                    if (word[stuck_bit] != stuck_value) {
                        printf("MEM(time %g): write high, address %d, stuck address %d —> writing array, altering stuck bit %d (%c to %c)",
dGetUserTime( ),int_addr,stuck_addr,stuck_bit,convert_lgc(word[stuck_bit]
),convert_lgc(stuck_value));
                    } else {
                        printf("MEM(time %g): write high, address %d, stuck address %d —> writing array",dGetUserTime( ),int_addr,stuck_addr);
                    }
                    word[stuck_bit] = stuck_value;
                    BufferToArray(word,0,data_bits-1,(uchar
*)ram,2,data_bits,int_addr,0);
                }
                /* end of newly added write function */
                /* start of originally added write statement
                printf("MEM(time %g): write high, address %d —> writing
array",dGetUserTime( ),int_addr);
                iGetArrayValue(data,(uchar *)ram,2,int_addr);
                end of originally added write statement */
                if (stuck_addr == -1) {
                  printf(" —— GOOD MACHINE!!!\n");
                } else {
                  printf("\n");
                }
            } else {
                printf("MEM(time %g): write high, address X —> filling array
with Xs",dGetUserTime( ));
                FillArrayValue((uchar *)ram,2,data_bits,0,total_lines-
1,(int)lgcX);
                if (stuck_addr == -1) {
                  printf(" —— GOOD MACHINE!!!\n");
                } else {
                  printf("\n");
                }
            }
        } else if (lgc_write == lgcX) {
            if (int_addr >= 0) {
                printf("MEM(time %g): write X, address %d —> filling word with
Xs",dGetUserTime( ),int_addr);
                FillArrayValue((uchar
*)ram,2,data_bits,int_addr,int_addr,(int)lgcX);
            } else {
                printf("MEM(time %g): write X, address X —> filling array with
Xs",dGetUserTime( ), int_addr);
                FillArrayValue((uchar *)ram,2,data_bits,0,total_lines-
1,(int)lgcX);
            }
```

TABLE 4-continued

```
        if (stuck_addr == -1) {
            printf(" —— GOOD MACINE!!!\n");
        } else {
            printf("\n");
        }
    }
    if (lgc_read == lgc1) {      /* reading */
        if (int_addr >= 0) {
            /* start of newly added read function */
            printf("MEM(time %g): read high, address %d —> reading
array",dGetUserTime( ),int_addr);
            SetArrayValue(output,(uchar *)ram,2,int_addr);
            /* end of newly added read function */
            /* start of originally added read function
            if (int_addr != stuck_addr) {
                if (stuck_addr != -1) {
                    printf("MEM(time %g): read high, address %d, stuck address
%d —> reading array",
                        dGetUserTime( ),int_addr,stuck_addr);
                } else {
                    printf("MEM(time %g): read high, address %d
—> reading array",
                        dGetUserTime( ),int_addr);
                }
                SetArrayValue(output,(uchar *)ram,2,int_addr);
            } else {
                ArrayToBuffer(word,0,data_bits-1,(uchar
*)ram,2,data_bits,int_addr,0);
                if (word[stuck_bit] != stuck_value) {
                    printf("MEM(time %g): read high, address %d, stuck address
%d —> reading array, altering stuck bit %d (%c to %c)",
                        dGetUserTime( ),int_addr,stuck_addr,stuck_bit,convert_lgc(word[stuck_bit]
),convert_lgc(stuck_value));
                } else {
                    printf("MEM(time %g): read high, address %d, stuck address
%d —> reading array",dGetUserTime( ),int_addr,stuck_addr);
                }
                word[stuck_bit] = stuck_value;
                BufferToOutput(output,0,word,0,data_bits-1);
            }
            end of originally added read function */
            printf(", pending output: ");
            for (i=0;i<data_bits;i++) {
printf("%c",convert_lgc(lgcGetPending(usrpinSelectPin(output,i))));
            }
            if (stuck_addr == -) {
                printf(" —— GOOD MACINE!!!\n");
            } else {
                printf("\n");
            }
        } else {
            printf("MEM(time %g): read high, address X —> sourcing
Xs",dGetUserTime( ),int_addr);
            SetPinLgc(output,lgcX);
            if (stuck_addr == -1) {
                printf(" —— GOOD MACHINE!!!\n");
            } else {
                printf("\n");
            }
        }
    } else if (lgc_read == lgcX) {
        printf("MEM(time %g): read X —> sourcing
Xs",dGetUserTime( ),int_addr);
        SetPinLgc(output,lgcX);
        if (stuck_addr == -1) {
            printf(" —— GOOD MACINE!!!\n");
        } else {
            printf("\n");
        }
    }
    } else if (lgc_clock == lgcX) {
        printf("MEM(time %g): clock X —'2 sourcing
Xs$n",dGetUserTime( ),int_addr);
        SetPinLgc(output,lgcX);
    }
}
```

We claim:

1. A method for fault simulation testing of circuits, the method comprising the steps of:
   (a) providing a dynamically alterable behavioral model code of a circuit to be tested, said code able to perform a plurality of unique testing functions each simulating unique faults internal to said circuit wherein the behavioral model comprises at least one simulated fault bus line for receiving code input from a fault simulation tool, said simulated fault bus line not part of the circuit to be tested nor receptive of input from the circuit to be tested;
   (b) applying fault simulation test data directly to the behavioral model through the simulated fault bus;
   (c) altering the behavioral model responsive to said fault simulation test data to perform at least one of said unique testing functions, wherein each unique testing function is enabled to test said circuit responsive to said fault simulation test data on said simulated fault bus; and
   (d) recording the behavior of the behavioral model.

2. The method of claim 1 wherein the step of applying fault simulation test data to the behavioral model comprises the step of applying mapping fault data to at least one line of the fault bus.

3. The method of claim 1 wherein the step of applying fault simulation test data to the behavioral model comprises the step of applying mapping fault data to the plurality of fault bus lines.

4. The method of claim 1 wherein the step of applying fault simulation test data to the behavioral model comprises the step of applying mapping fault and test pattern data to the behavioral model.

5. The method of claim 3 wherein the step of applying fault simulation test data to the behavioral model further comprises associating the mapping fault data on the fault bus with a predetermined behavioral model behavior.

6. The method of claim 3 wherein the step of applying mapping fault data to the plurality of fault bus lines further comprises applying a stuck-at-1 fault on at least one of the plurality of fault bus lines.

7. The method of claim 3 wherein the step of applying mapping fault data to the plurality of fault bus lines further comprises applying a stuck-at-0 fault on at least one of the plurality of fault bus lines.

8. A method for determining whether a test pattern will detect a defect in an embedded circuit, the method comprising the steps of:
   (a) providing a fault simulation testing tool for testing circuit designs;
   (b) providing a dynamically alterable behavioral model code of a circuit to be tested, said code able to perform a plurality of unique testing functions each simulating unique faults internal to said circuit, wherein the behavioral model comprises at least one simulated fault bus line for receiving code input from a fault simulation tool, said simulated fault bus line not part of the circuit to be tested nor receptive of input from the circuit to be tested;
   (c) applying test data directly to the behavioral model through the simulated fault bus, wherein this step comprises the steps of:
      (1) applying mapping fault data on at least one simulated fault bus line; and
      (2) applying test pattern data to the behavioral model;
   (d) associating the mapping fault data predetermined defect in the behavioral model;
   (e) altering the behavioral model responsive to said fault simulation data to perform at least one of said unique testing functions, wherein each unique testing function is enabled to test said circuit responsive to said fault simulation test data on said simulated fault bus; and
   (f) causing the behavioral model to perform in accord with the predetermined defect; and
   (g) analyzing the behavior of the behavioral model to determine whether the test pattern detected the predetermined defect.

9. The method of claim 8 wherein the step of applying test pattern data to the behavioral model further comprises the step of applying control and data information to the behavioral model.

10. The method of claim 8 wherein the step of associating the mapping fault data with a predetermined defect in the behavioral model comprises the steps of:
    (a) reading the fault bus to determine the value of the mapping fault data present thereon; and
    (b) mapping the value to a predetermined defect in the behavioral model.

11. The method of claim 8 wherein the step of applying mapping fault data on at least one fault bus line comprises the step of applying a stuck-at-1 fault.

12. The method of claim 8 wherein the step of applying mapping fault data on at least one fault bus line comprises the step of applying a stuck-at-0 fault.

13. A system for determining whether a test pattern will detect a defect in a circuit, the system comprising:
    (a) a dynamically alterable behavioral model code of a circuit to be tested, said code able to perform a plurality of unique testing functions each simulating unique faults internal to said circuit the model comprising:
       (1) a simulated fault bus having at least one line for receiving code input from a fault simulation tool, said simulated fault bus line not part of the circuit to be tested nor receptive of input from the circuit to be tested;
       (2) logic for determining a mapping fault value on the fault bus;
       (3) logic for associating the mapping fault value with a predetermined defect;
       (4) logic for altering the behavioral model responsive to said fault simulation data to perform at least one of said unique testing functions, wherein each unique testing function is enabled to test said circuit responsive to said fault simulation test data on said simulated fault bus; and
       (5) logic for causing the behavioral model to act according to the predetermined defect;
    (b) a fault simulation tool for applying test data to at least one behavioral model, the test data comprising mapping fault data and test pattern data, the tool comprising:
       (1) logic for applying at least one set of test data to at least one behavioral model; and
       (2) logic for analyzing the results of the applied test data to determine whether the test pattern detected the predetermined defect.

14. The system of claim 13 wherein logic for determining a mapping fault value on the fault bus comprises logic for reading the fault bus lines for at least one stuck-at-1 fault.

15. The system of claim 13 wherein the logic for determining a mapping fault value on the fault bus comprises logic for reading the fault bus lines for at least one stuck-at-0 fault.

16. The system of claim 13 wherein the logic for applying at least one set of test data to at least one behavioral model comprises logic for applying at least one set of mapping fault data to the fault bus and test pattern data to the input ports of the behavioral model.

17. The system of claim 13 further comprising a fault-free behavioral model for the application of test data.

18. The system of claim 17 wherein the logic for analyzing the results of the applied test data to determine whether the test pattern detected the predetermined defect comprises logic for analyzing the results of the fault-free behavioral model.

19. The system of claim 18 wherein the logic for analyzing the results of the applied test data to determine whether the test pattern detected the predetermined defect comprises logic for comparing the results of a fault-free behavioral model and a faulty behavioral model.

20. The system of claim 13 wherein the behavioral model comprises an embedded circuit.

21. A method for fault simulation testing of circuits, the method comprising the steps of:

(a) providing a circuit to be tested, said circuit having at least one input;

(b) providing a fault simulation tool having a fault simulation algorithm;

(c) providing a dynamically alterable behavioral model code of the circuit to be tested, wherein the behavioral model comprises at least one simulated fault bus line, said fault bus line having a plurality of bits;

(d) applying stimulus data to the circuit at at least one circuit input, said input not the fault bus line;

(e) applying fault simulation test data to the behavioral model through the fault bus, wherein said fault data may include a fault value on one or more of the fault bus bits; and (f) recording the behavior of the behavioral model;

wherein the fault simulation test data may dynamically alter the function of the behavioral model, such that the behavioral model may describe a good or a faulty embodiment of the circuit to be tested, and wherein the fault simulation tool will apply the fault simulation data to the behavioral model through the fault bus line responsive to the fault simulation algorithm.

* * * * *